(12) United States Patent
Banba

(10) Patent No.: US 11,153,967 B2
(45) Date of Patent: Oct. 19, 2021

(54) HIGH-FREQUENCY MODULE

(71) Applicant: Murata Manufacturing Co., Ltd., Kyoto (JP)

(72) Inventor: Shinichiro Banba, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/004,961

(22) Filed: Aug. 27, 2020

(65) Prior Publication Data

US 2020/0396829 A1 Dec. 17, 2020

Related U.S. Application Data

(63) Continuation of application No. PCT/JP2019/010729, filed on Mar. 15, 2019.

(30) Foreign Application Priority Data

Mar. 20, 2018 (JP) .............................. JP2018-052670

(51) Int. Cl.
*H05K 1/02* (2006.01)
*H01L 23/66* (2006.01)
*H05K 1/18* (2006.01)

(52) U.S. Cl.
CPC ........... *H05K 1/0243* (2013.01); *H01L 23/66* (2013.01); *H05K 1/181* (2013.01); *H01L 2223/6605* (2013.01)

(58) Field of Classification Search
CPC .. H05K 1/02; H05K 1/14; H05K 1/18; H05K 1/181–187; H05K 7/06; H01L 23/495;

(Continued)

(56) References Cited

U.S. PATENT DOCUMENTS 9,545,026 B2 * 1/2017 Fukuda .................. H01L 25/16
10,368,439 B2 * 7/2019 Elsherbini .............. H05K 3/303
(Continued)

FOREIGN PATENT DOCUMENTS

JP 2007123595 A 5/2007
JP 2007317754 A 12/2007
(Continued)

OTHER PUBLICATIONS

International Search Report issued in Application No. PCT/JP2019/010729, dated May 14, 2019.

(Continued)

*Primary Examiner* — Tuan T Dinh
(74) *Attorney, Agent, or Firm* — Pearne & Gordon LLP

(57) ABSTRACT

A high-frequency module (1) includes a component (3*a*) mounted on an upper surface (2*a*) of a substrate (2), a second sealing resin layer (4) stacked on the upper surface (2*a*) of the substrate (2), a component (3*b*) mounted on a lower surface (2*b*) of the substrate (2), a first sealing resin layer (5) stacked on the lower surface (2*b*) of the substrate (2), and a first terminal assembly (6) and a second terminal assembly (7) that are mounted on the lower surface (2*b*) of the substrate (2). The first terminal assembly (6) is mounted on a four-corner portion of the substrate (2) and includes a connection conductor (6*a*) thicker than a connection conductor (7*a*) of the second terminal assembly (7).

7 Claims, 9 Drawing Sheets

(58) Field of Classification Search
CPC ... H01L 23/498; H01L 23/4981; H01L 21/16; H01L 21/56; H01L 21/268; H01L 21/768
USPC ............ 361/760–764, 770–790, 803; 257/720–730, 787–790; 174/520
See application file for complete search history.

(56) References Cited

U.S. PATENT DOCUMENTS

| | | | |
|---|---|---|---|
| 2007/0200221 A1* | 8/2007 | Suesada | H01L 23/49838 257/701 |
| 2008/0283279 A1* | 11/2008 | Ogawa | H01L 23/49811 174/255 |
| 2009/0224403 A1 | 9/2009 | Fujii | |
| 2012/0320536 A1* | 12/2012 | Yamamoto | H05K 3/4007 361/728 |
| 2013/0137025 A1* | 5/2013 | Kawahara | G03G 21/18 430/56 |
| 2015/0001690 A1* | 1/2015 | Nam | H01L 23/13 257/659 |
| 2015/0091177 A1* | 4/2015 | Hong | H01L 24/29 257/773 |
| 2016/0315027 A1* | 10/2016 | Ryu | H01L 23/293 |

FOREIGN PATENT DOCUMENTS

| | | |
|---|---|---|
| JP | 2009212474 A | 9/2009 |
| JP | 5510461 B2 | 6/2014 |
| WO | 2011129161 A1 | 10/2011 |

OTHER PUBLICATIONS

Written Opinion issued in Application No. PCT/JP2019/010729, dated May 14, 2019.

\* cited by examiner

--PRIOR ART--

HIGH-FREQUENCY MODULE

This is a continuation of International Application No. PCT/JP2019/010729 filed on Mar. 15, 2019 which claims priority from Japanese Patent Application No. 2018-052670 filed on Mar. 20, 2018. The contents of these applications are incorporated herein by reference in their entireties.

BACKGROUND OF THE DISCLOSURE

Field of the Disclosure

The present disclosure relates to a high-frequency module in which a terminal assembly is mounted.

Description of the Related Art

A method for manufacturing a module including an interlayer connection conductor at low cost in a short manufacturing time by mounting a terminal connection substrate, in which a plurality of columnar terminal electrodes are connected to one another with an insulator interposed therebetween, on a module substrate has been proposed, and Patent Document 1 proposes such a method. For example, regarding a module substrate 100 illustrated in FIG. 9, electronic components 102 are mounted on surface electrodes of an upper surface 101a of a base substrate 101 and terminal connection substrates 103 are also mounted thereon. Each of the terminal connection substrates 103 is formed in a manner such that a plurality of columnar terminal electrodes 111 are aligned in each line on both side surfaces of an insulator 112. In the module substrate 100, the terminal connection substrates 103 are disposed so as to be substantially in contact with the two facing sides of the outer edge of the base substrate 101 and also disposed on a substantially central portion of the base substrate 101.

In this way, the plurality of terminal electrodes 111 are connected to one another by the insulator 112 to form a terminal assembly (the terminal connection substrate 103), and it is thereby possible to simplify a complex process in forming an external connection terminal in the module substrate 100. Thus, manufacturing costs can be reduced.

Patent Document 1: Japanese Patent No. 5510461 (refer to paragraphs 0052 through 0072, FIG. 5, and the like)

BRIEF SUMMARY OF THE DISCLOSURE

However, when the above-described module substrate 100 is mounted on an external substrate, the terminal electrodes 111 positioned in four-corner portions of the base substrate 101 are subjected to stress and thus tend to be easily damaged. In such a case, although a method in which connection strength is increased by increasing the size of the terminal electrodes 111 positioned in the four-corner portions of the base substrate 101 can be considered, to form the terminal connection substrate 103 by arranging the terminal electrodes 111 having different diameters in one terminal connection substrate 103, there is a problem that the number of manufacturing steps of the terminal connection substrate 103 increases and costs increase.

The present disclosure has been made in view of the above-described problem, and its objective is to provide a module in which bonding reliability when the module is mounted on the external substrate is increased by making the size of an external connection terminal, which is positioned in a corner portion of a substrate that is easily subjected to stress, larger than the size of another external connection terminal.

To achieve the above-described objective, a module according to the present disclosure includes a circuit board, a plurality of terminal assemblies provided on one main surface of the circuit board, and a first sealing resin layer configured to cover the one main surface of the circuit board and the plurality of terminal assemblies. Each of the plurality of terminal assemblies is formed by vertically arranging a plurality of connection conductors in a resin block and one end portion of each of the plurality of connection conductors is exposed at the resin block to be connected to the one main surface of the circuit board. The plurality of terminal assemblies are constituted by a first terminal assembly including the plurality of connection conductors and a second terminal assembly including the plurality of connection conductors that have a dimension parallel to the one main surface smaller than a dimension of the plurality of connection conductors of the first terminal assembly. The first terminal assembly is disposed on a corner portion of the one main surface of the circuit board.

According to such a configuration, the first terminal assembly and the second terminal assembly are prepared. The external connection terminals of the first terminal assembly have a thickness different from that of the external connection terminals of the second terminal assembly. The first terminal assembly having the external connection terminals larger than those of the second terminal assembly is disposed on a portion of the module to which stress is likely to be applied. Thus, it is possible to increase the connection reliability of the external connection terminals. To provide external connection terminals having different sizes in one terminal assembly, the number of manufacturing steps increases. However, the manufacturing costs can be reduced by providing the external connection terminals of the first terminal assembly and the external connection terminals of the second terminal assembly with different thicknesses.

When the module is mounted on an external substrate, stress is likely to be applied especially to the corner portion of a substrate and damage may be caused. However, the connection strength can be increased by mounting the first terminal assembly, which includes the external connection terminals larger than those of the second terminal assembly, on the corner portion of the substrate.

In addition, to achieve the above-described objective, a module according to the present disclosure includes a circuit board, a plurality of terminal assemblies provided on one main surface of the circuit board, and a first sealing resin layer configured to cover the one main surface of the circuit board and the plurality of terminal assemblies. Each of the plurality of terminal assemblies is formed by vertically arranging a plurality of connection conductors in a resin block and one end portion of each of the plurality of connection conductors is exposed at the resin block to be connected to the one main surface of the circuit board. The plurality of terminal assemblies are constituted by a third terminal assembly including the plurality of connection conductors and a fourth terminal assembly including the plurality of connection conductors that are aligned at wide intervals compared with the plurality of connection conductors of the third terminal assembly. The third terminal assembly is disposed on a corner portion of the one main surface of the circuit board.

According to such a configuration, the third terminal assembly in which the external connection terminals are aligned at small intervals is mounted on a portion of a substrate, to which stress is likely to be applied, so that the external connection terminals are arranged closer to one another, and such stress can thereby be dispersed. Thus, the connection reliability when the module is mounted on the external substrate can be increased.

When the module is mounted on the external substrate, stress is likely to be applied especially to the corner portion of the substrate and damage may be caused. However, the connection strength can be increased by dispersing such stress by mounting the third terminal assembly on the corner portion of the substrate and arranging the external connection terminals closer to one another.

In addition, the resin block may be made of a resin having a dielectric loss tangent smaller than a dielectric loss tangent of a resin that forms the first sealing resin layer. According to such a configuration, the resin used for the sealing resin layer has a low dielectric characteristic (permittivity or the dielectric loss tangent is large), and stray capacitance between the external connection terminals is thereby likely to be formed in a high-frequency range and signal loss thus increases. However, the stray capacitance between the external connection terminals can be reduced by forming the resin block by using a resin having a small dielectric loss tangent, and signal loss can thus be reduced.

In addition, a component mounted on another main surface of the circuit board, and a second sealing resin layer configured to cover the other main surface of the circuit board and the component may further be included. According to such a configuration, it is possible to provide the module that is a double-sided-mounting type and has high connection reliability.

According to the present disclosure, the bonding reliability after the module is mounted on the external substrate can be increased by increasing the size of the external connection terminal positioned in the corner portion of the substrate that is easily subjected to stress when the module is mounted on the external substrate.

BRIEF DESCRIPTION OF THE SEVERAL VIEWS OF THE DRAWINGS

Each of FIGS. 1A and 1B is a sectional view of a module according to Embodiment 1 of the present invention.

Figure 1A:
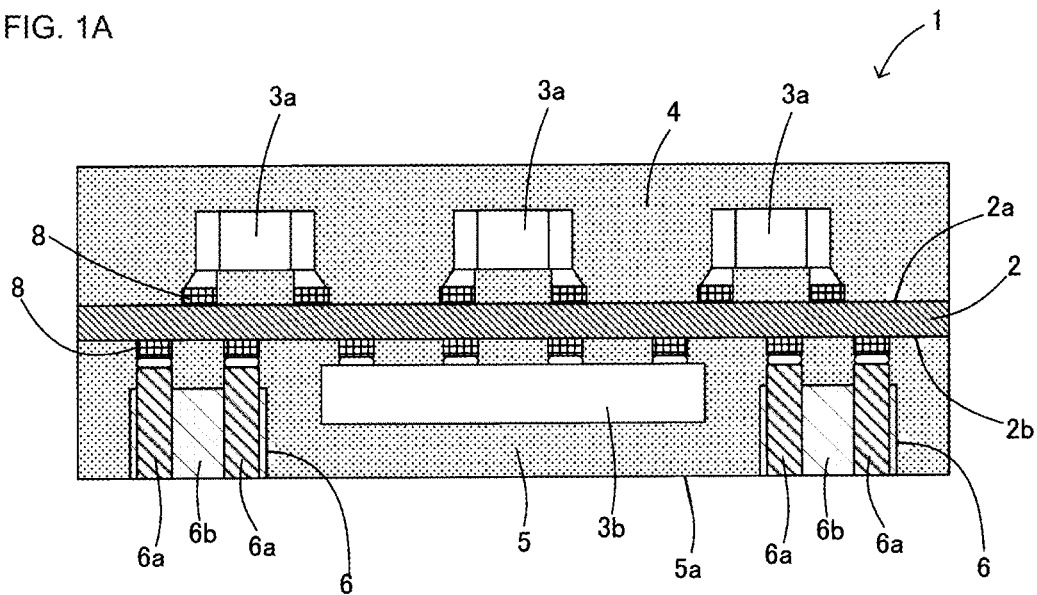
Figure 1B:
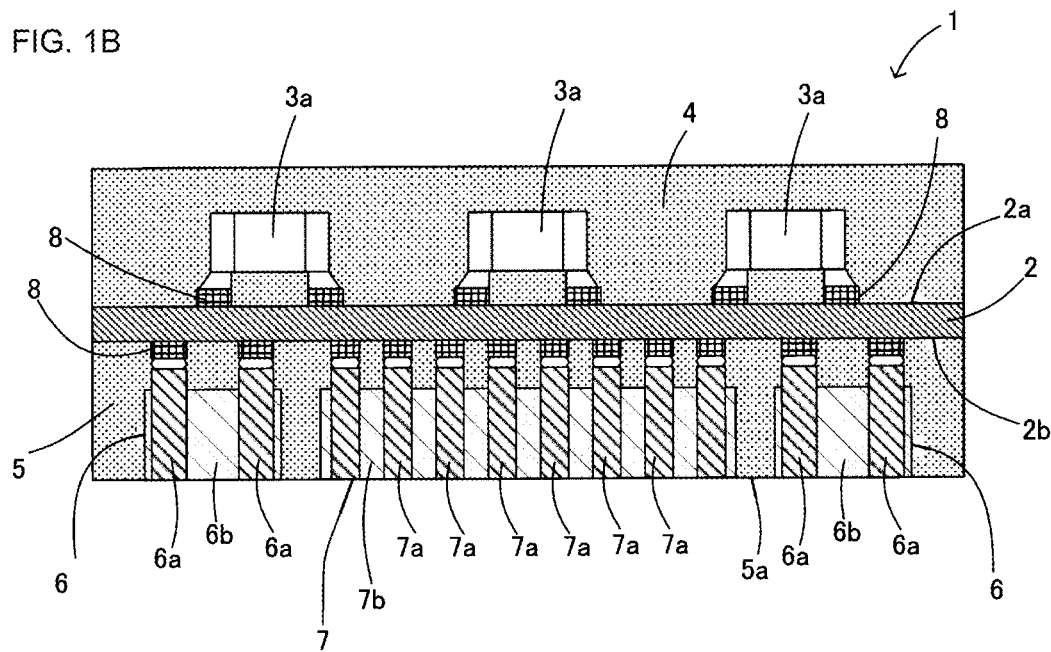

Each of FIGS. 4A, 4B, 4C and 4D is a schematic view of terminal assemblies to be mounted in FIGS. 1A and 1B.

Each of FIGS. 5A, 5B, 5C and 5D illustrates a method for manufacturing an example of a terminal assembly.

Figure 6A:
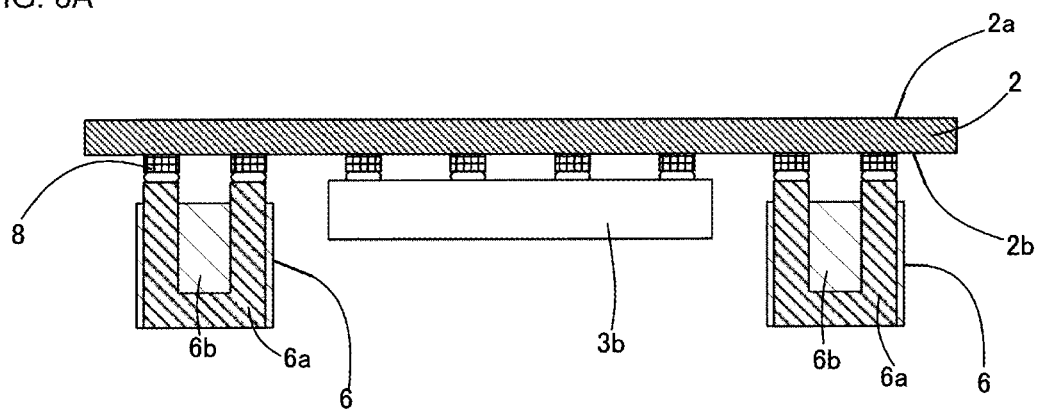
Figure 6B:
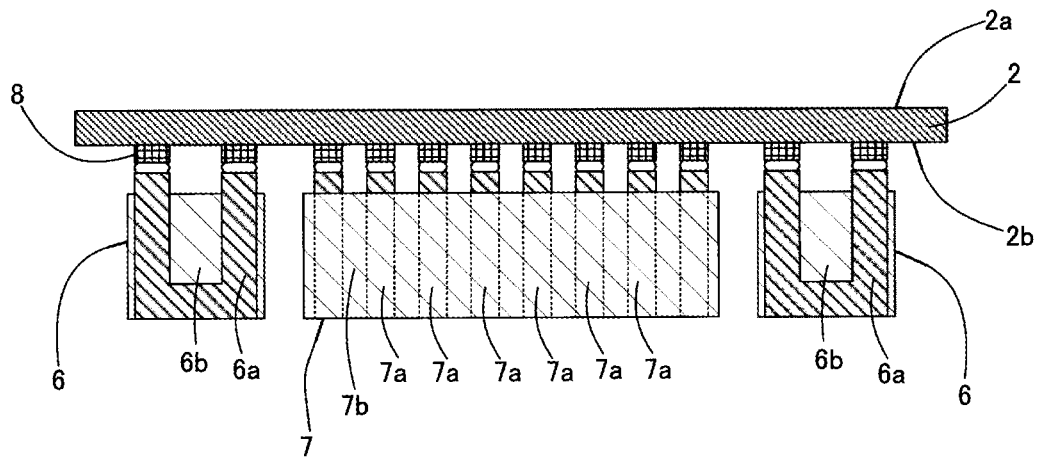

Each of FIGS. 6A and 6B illustrates a part of a process of a method for manufacturing the module in FIGS. 1A and 1B.

Figure 7A:
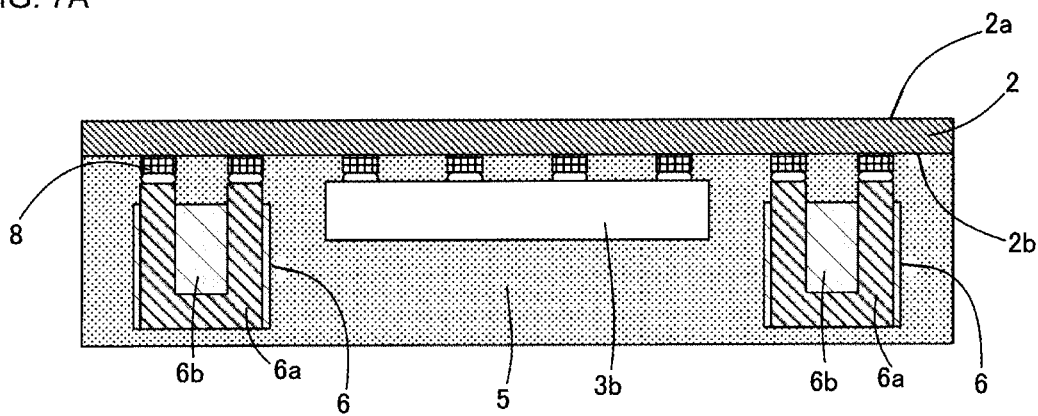
Figure 7B:
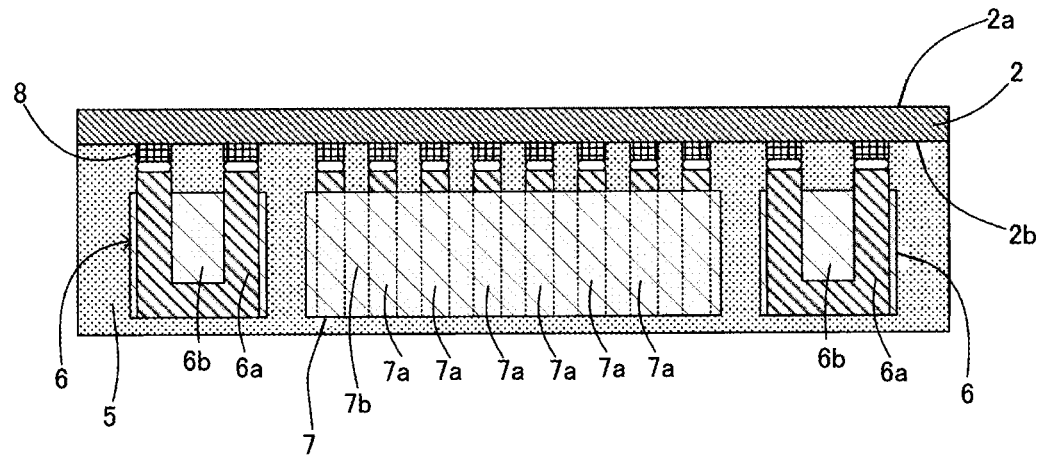

Each of FIGS. 7A and 7B illustrates a part of the process of the method for manufacturing the module in FIGS. 1A and 1B.

Figure 8A:
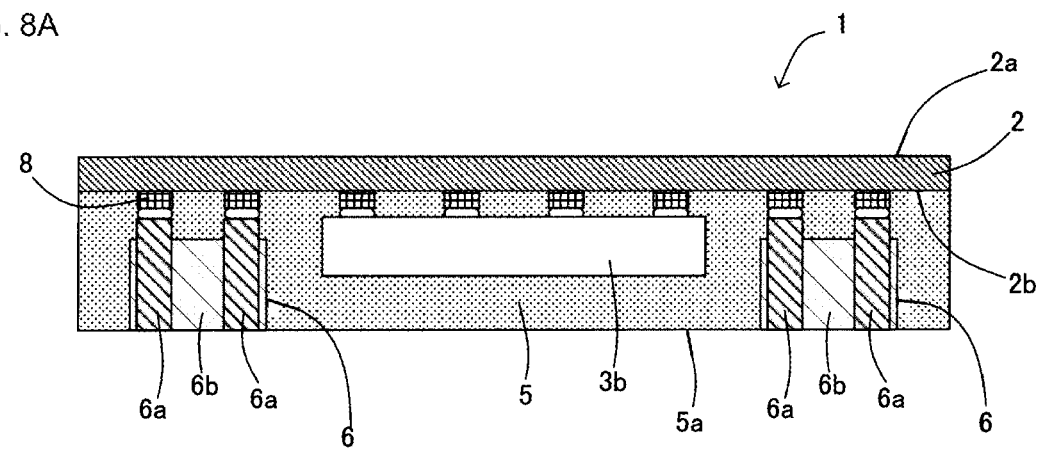
Figure 8B:
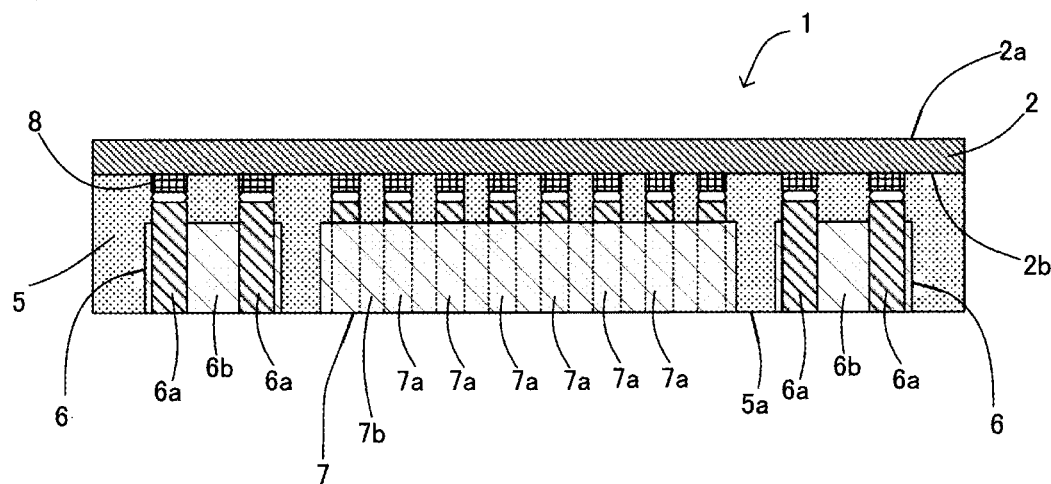

Each of FIGS. 8A and 8B illustrates a part of the process of the method for manufacturing the module in FIGS. 1A and 1B.

Figure 9:
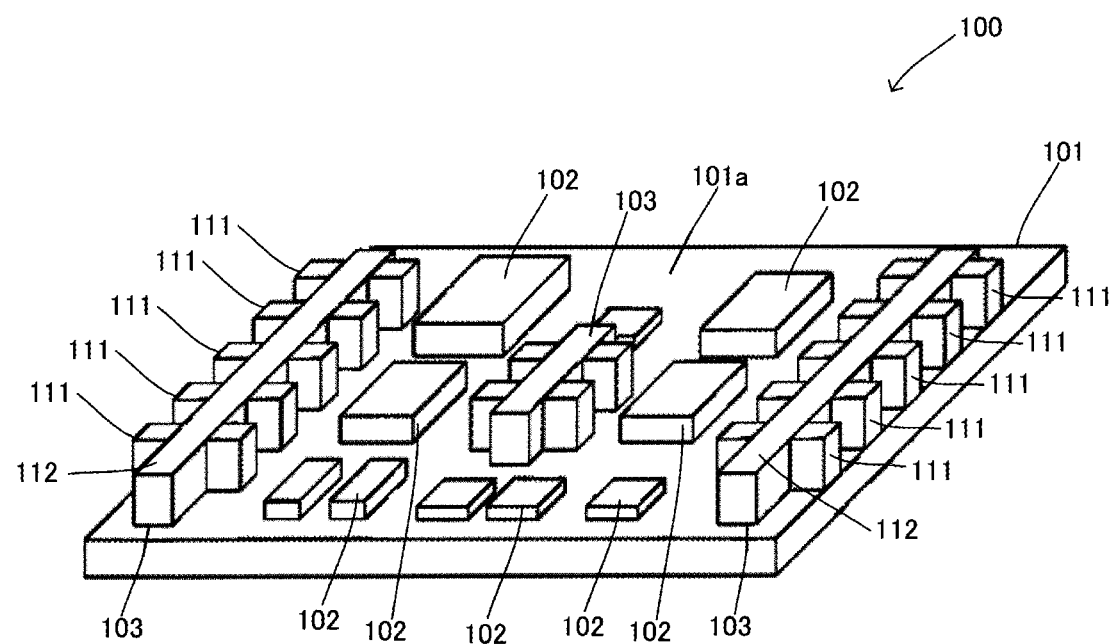

FIG. 9 is a sectional view of a module of the related art.

DETAILED DESCRIPTION OF THE DISCLOSURE

Figure 2:
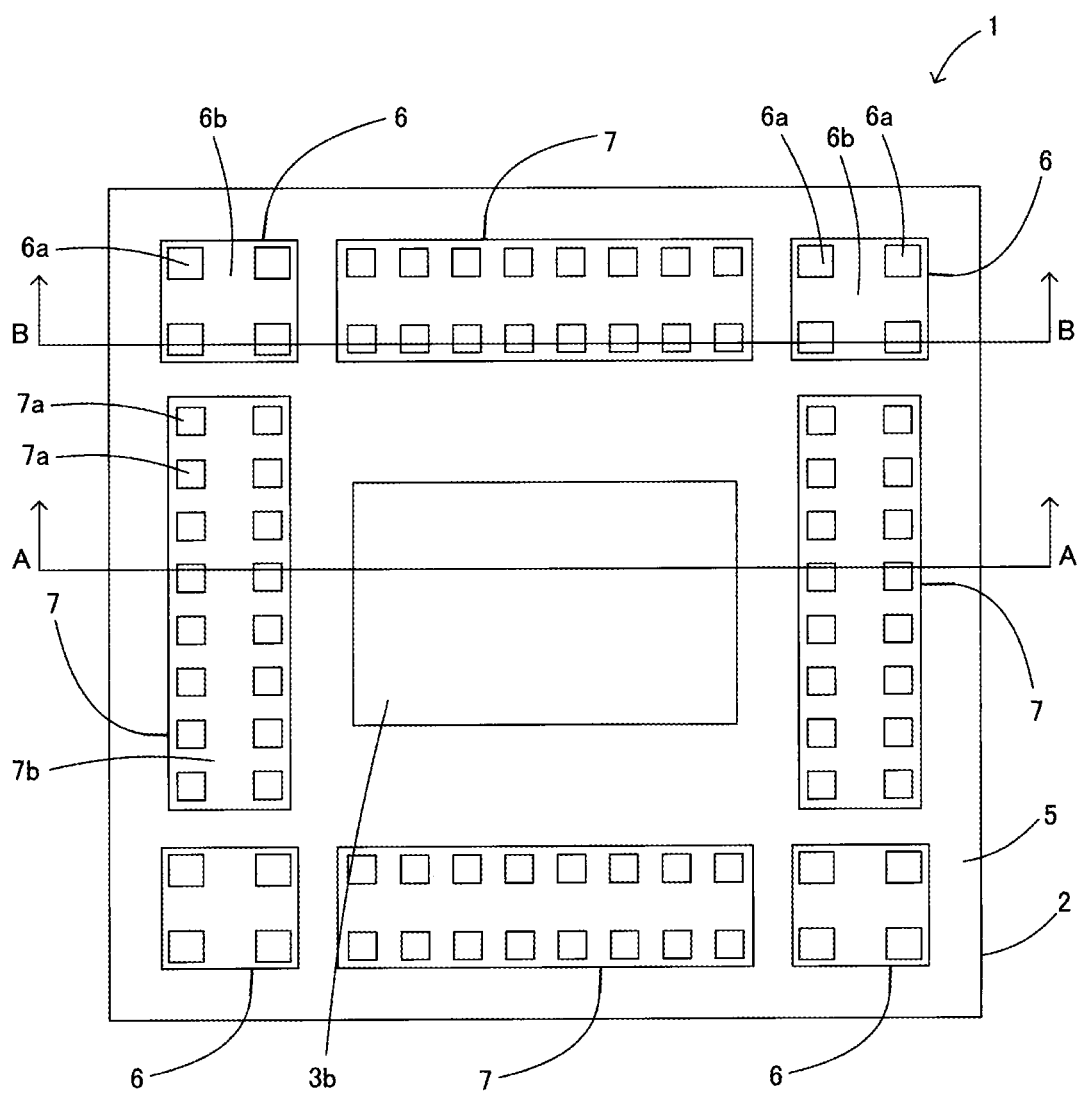
FIG. 2 is a plan view of the module in FIGS. 1A and 1B.

A high-frequency module 1 according to an embodiment of the present disclosure will be described with reference to FIGS. 1A, 1B and 2. In FIGS. 1A and 1B, FIG. 1A is a sectional view of the high-frequency module 1 according to Embodiment 1 in FIG. 2 taken along line A-A, and FIG. 1B is a sectional view of the high-frequency module 1 in FIG. 2 taken along line B-B. FIG. 2 is a plan view of the high-frequency module 1.

As FIGS. 1A, 1B and 2 illustrate, the high-frequency module 1 according to the present embodiment includes a substrate 2 having an upper surface 2a (corresponding to "another main surface" of the present invention) and a lower surface 2b (corresponding to "one main surface" of the present invention). A plurality of components 3a are mounted on the upper surface 2a, and a component 3b is mounted on the lower surface 2b. A second sealing resin layer 4 is stacked on the upper surface 2a, and a first sealing resin layer 5 is stacked on the lower surface 2b. The high-frequency module 1 further includes a plurality of first terminal assemblies 6 and a plurality of second terminal assemblies 7 that are mounted on the lower surface 2b of the substrate 2. The high-frequency module 1 is mounted on, for example, a mother substrate of an electronic device (not illustrated).

The substrate 2 is made of, for example, a low-temperature co-fired ceramic, a glass epoxy resin, or the like. On the upper surface 2a and the lower surface 2b of the substrate 2, a plurality of land electrodes 8 are formed. In surface layers and an inner layer of the substrate 2, a plurality of ground electrodes (not illustrated), a plurality of wiring electrodes (not illustrated), a plurality of via conductors (not illustrated), and the like are formed. The ground electrodes are each formed, for example, so as to be exposed at a side surface of the substrate 2.

Each of the land electrodes 8, the ground electrodes, and the wiring electrodes is made of a metal typically used for an electrode, such as Cu, Ag, or Al. Each of the via conductors is made of a metal such as Ag or Cu.

Examples of the component 3a and the component 3b include components such as an inductor, a capacitor, an IC, and a power amplifier. The components 3a and the component 3b are mounted on the upper surface 2a and the lower surface 2b of the substrate 2, respectively, by connecting connection terminals (not illustrated) to the respective land electrodes 8 formed on the upper surface 2a and the lower surface 2b of the substrate 2 by using solder.

The second sealing resin layer 4 is provided on the upper surface 2a of the substrate 2 so as to cover the upper surface 2a of the substrate 2 and each of the components 3a, and the first sealing resin layer 5 is provided on the lower surface 2b of the substrate 2 so as to cover the lower surface 2b of the substrate 2, the component 3b, and each of the terminal assemblies 6. Both the sealing resin layers 4 and 5 can be made of a resin typically used as a sealing resin, such as an epoxy resin containing a silica filler. To achieve high heat conduction, a filler having a high thermal conductivity, such as an alumina filler, may also be used.

Figure 3A:
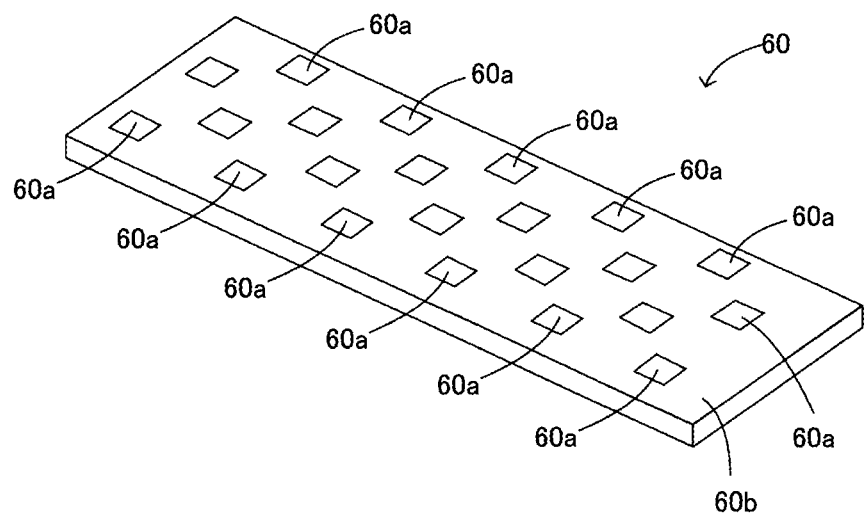
FIGS. 3A and 3B illustrate examples of a terminal assembly to be mounted in FIGS. 1A and 1B.
Figure 3B:
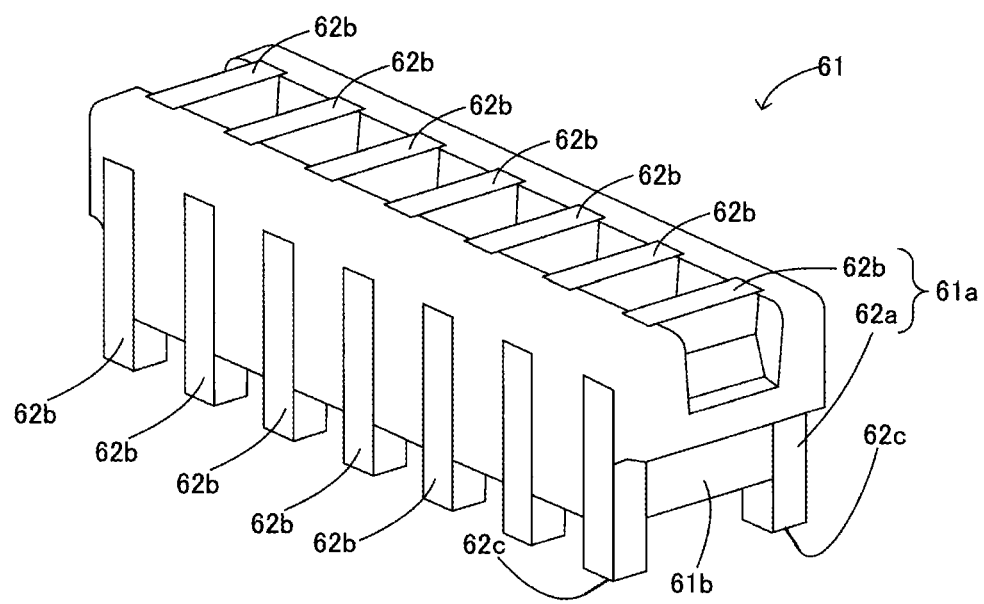

Each of the first terminal assemblies 6 is formed in a manner such that a plurality of connection conductors 6a are aligned and integrated by using a resin block 6b, and each of the second terminal assemblies 7 is formed in a manner such that a plurality of connection conductors 7a are aligned and integrated by using a resin block 7b. For example, as with a terminal assembly 60 illustrated in FIG. 3A, a terminal assembly in which connection conductors 60a staggered at regular intervals are integrated by using a resin block 60b can be used. Alternatively, as with a terminal assembly 61 illustrated in FIG. 3B, a terminal assembly in which connection conductors 61a each including a pair of leg portions 62a arranged in substantially parallel and a bridging portion 62b connecting an end of one leg portion 62a to an end of the other leg portion 62a are aligned at regular intervals and integrated by using a resin block 61b can be used. After the terminal assembly 61 is mounted on the lower surface 2b of the substrate 2, the first sealing resin layer 5 is stacked and the bridging portions 62b are removed through a step such as polishing or grinding, and the terminal assembly 61 thus functions as an external connection terminal of the high-frequency module 1. The resin blocks 60b and 61b are preferably made of a liquid crystal polymer resin having a dielectric loss tangent lower than that of a resin used for both the sealing resin layers 4 and 5. In the high-frequency module 1 of the present embodiment, a terminal assembly having the same shape as that of the terminal assembly 61 is mounted.

Figures 4A, 4B, 4C, 4D:
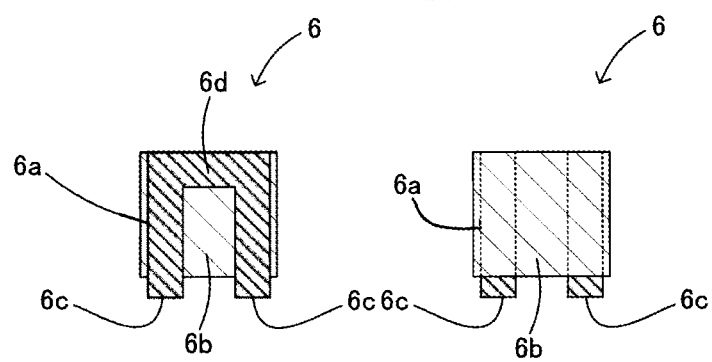

As FIG. 2 illustrates, the first terminal assemblies 6 are mounted on the four-corner portions of the lower surface 2b of the substrate 2, and the second terminal assemblies 7 are mounted on a portion other than the four-corner portions. The connection conductor 6a of the first terminal assembly 6 is formed so as to be thicker than the connection conductor 7a of the second terminal assembly 7, and the first terminal assembly 6 thereby has a resistance to stress, which is applied when the high-frequency module 1 is mounted on the external substrate, greater than that of the second terminal assembly 7. Thus, the first terminal assemblies 6 are disposed on the four-corner portions of the substrate 2 to which stress is likely to be applied. The second terminal assemblies 7 are mounted on the portion other than the four-corner portions. As FIG. 4A illustrates, the first terminal assembly 6 is formed in a manner such that a plurality of connection conductors 6a that are formed of a metal pin or a metal plate having a sectional shape 0.5 mm square and being bent to have a U shape are integrated by using the resin block 6b made of a liquid crystal polymer or the like having a dielectric loss tangent lower than that of an epoxy resin that forms the first sealing resin layer 5. As FIG. 4B illustrates, in the present embodiment, two connection conductors 6a are integrated by using the resin block 6b. As FIG. 4C illustrates, the second terminal assembly 7 is formed in a manner such that a plurality of connection conductors 7a that are formed of a metal pin or a metal plate having a sectional shape 0.3 mm square and being bent to have a U shape are integrated by using the resin block 7b made of a liquid crystal polymer or the like having a dielectric loss tangent lower than that of an epoxy resin that forms the first sealing resin layer 5. As FIG. 4D illustrates, in the present embodiment, eight connection conductors 7a are integrated by using the resin block 7b.

Regarding each of the terminal assemblies 6 and 7, end portions 6c and 7c of the respective connection conductors 6a and 7a that are portions exposed at the respective resin blocks 6b and 7b are connected to the substrate 2, the first sealing resin layer is formed, the terminal assemblies 6 and 7 having respective shapes illustrated in FIGS. 1A and 1B are then formed by shaving off bridging portions 6d and 7d when a lower surface 5a of the first sealing resin layer is polished, and each of the terminal assemblies 6 and 7 thus functions as an external connection terminal of the high-frequency module 1. To suppress signal loss by reducing the stray capacitance between the external connection terminals, the resin blocks 6b and 7b are formed by using a liquid crystal polymer resin having a dielectric loss tangent smaller than that of a resin for the first sealing resin layer 5. The sectional shape and the number of the connection conductors 6a and 7a can be changed as appropriate.

Figure 5A:
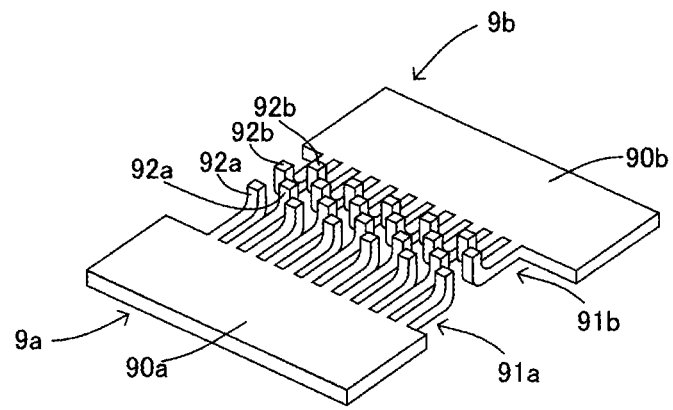
Figure 5B:
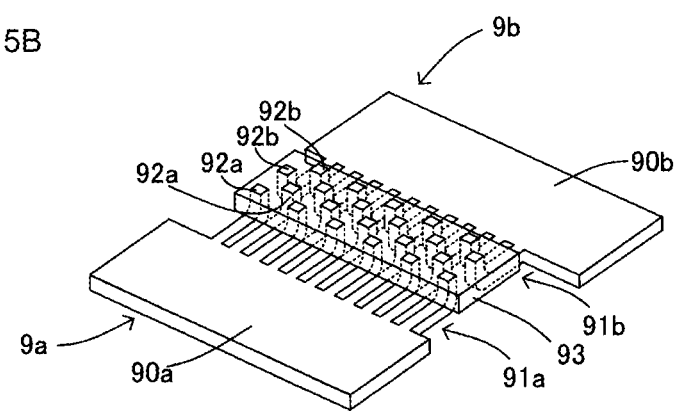
Figure 5C:
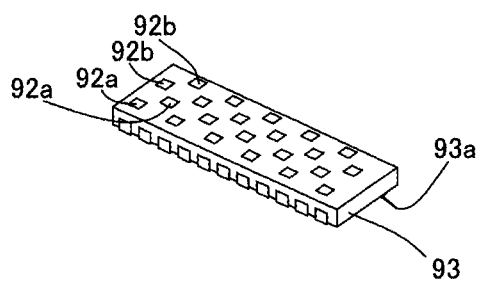
Figure 5D:
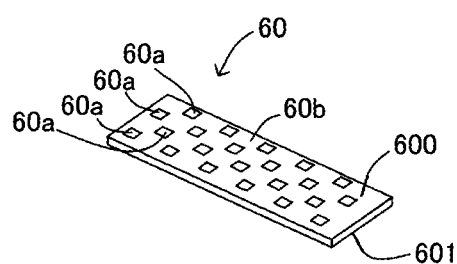

Here, a method for manufacturing the terminal assembly 60 will be described with reference to FIGS. 5A, 5B, 5C and 5D. First, FIG. 5A illustrates, two metal hoops are each subjected to punching to form parts 9a and 9b having respective support portions 90a and 90b that have respective comb-tooth portions 91a and 91b. Distal ends of both the comb-tooth portions 91a and 91b are subjected to bending to form a plurality of terminal portions 92a and 92b that are to be the connection conductors 61a, and the parts 9a and 9b are then aligned. Next, as FIG. 5B illustrates, the terminal portions 92a and 92b are each molded by a liquid crystal polymer resin to form a structure in which the terminal portions 92a and 92b are each integrated by using a resin 93. Next, as FIG. 5C illustrates, the parts 9a and 9b are cut off from the resin 93. Finally, a lower surface 93a of the resin 93 is polished to complete the terminal assembly 60. As FIG. 5D illustrates, the terminal assembly 60 has a structure in which a plurality of connection conductors 60a on a prism are staggered in the resin block 60b, and the connection conductors 60a are exposed at an upper surface 600 and a lower surface 601 of the resin block 60b.

(Method for Manufacturing Module)

Next, a method for manufacturing the high-frequency module 1 will be described with reference to FIGS. 6A to 8B. In Embodiment 1, after an assembly of a plurality of high-frequency modules 1 is formed, the assembled high-frequency modules 1 are separated from one another to manufacture individual high-frequency modules 1. The components mounted on the upper surface 2a of the substrate 2 and the second sealing resin layer 4 are omitted from the figures.

First, the substrate 2 in which a plurality of land electrodes 8 are formed on the upper surface 2a and the lower surface 2b and a plurality of ground electrodes, a plurality of wiring electrodes, a plurality of via conductors, and the like are formed in the surface layers and the inner layer is prepared. Each of the land electrodes 8, the ground electrodes, and the wiring electrodes can be formed by, for example, screen-printing with conductive paste containing a metal such as Cu, Ag, or Al. Each of the via conductors can be formed by using a known method after via holes are formed by using a laser or the like. As FIGS. 6A and 6B illustrate, by using a known surface mount technology, the components 3a are each mounted on the upper surface 2a of the substrate 2, and the components 3b and the terminal assemblies 6 and 7 are each mounted on the lower surface 2b. For example, portions of solder are formed on desired ones of the land electrodes 8 formed on the lower surface 2b of the substrate 2, the components 3 and the terminal assemblies 6 and 7 are each mounted on corresponding ones of the land electrodes 8 on which the portions of solder are formed, and reflow processing is then performed. The first terminal assemblies 6 are mounted on the four-corner portions of the lower surface 2b of the substrate 2 (refer to FIG. 2). The second terminal assemblies 7 are mounted on the portion of the lower surface 2b of the substrate 2 other than the four-corner portions. In the present embodiment, as FIG. 2 illustrates, although the terminal assemblies 6 are mounted on the four-corner portions of the lower surface 2b of the substrate 2 and the second terminal assemblies 7 are mounted on an outer edge portion other than the four-corner portions, each of the terminal assemblies 6 and 7 is not limited to being mounted on a peripheral portion of the lower surface 2b of the substrate 2 and may be mounted on an inner portion of the lower surface 2b of the substrate 2.

Next, as FIGS. 7A and 7B illustrate, the second sealing resin layer 4 and the first sealing resin layer 5 are formed so as to cover the components 3 and the terminal assemblies 6 and 7 that are mounted on a corresponding one of the upper surface 2a and the lower surface 2b of the substrate 2. Both the sealing resin layers 4 and 5 can be formed by using a method such as a transfer molding method, a compression molding method, a liquid resin method, or a sheet resin method. An epoxy resin containing a known silica filler can be used for both the sealing resin layers 4 and 5. To enable both the sealing resin layers 4 and 5 to have a high thermal conductive ability, an epoxy resin containing a filler having a high thermal conductivity, such as an alumina filler, can also be used. Before both the sealing resin layers 4 and 5 are formed, plasma cleaning of the substrate 2 may be performed as needed.

Next, as FIGS. 8A and 8B illustrate, the lower surface 5a of the first sealing resin layer 5 is polished or grinded to remove the bridging portions 6d and 7d of the terminal assemblies 6 and the terminal assemblies 7. At this time, Ni/Au plating may be applied to the connection conductors 6a and 7a that have exposed at a lower surface 5b of the first sealing resin layer 5. Thereafter, the assembled high-frequency modules 1 are separated from one another by a known method such as a method using a dicer or laser processing. Thereafter, by using a sputtering apparatus or a vacuum deposition apparatus, a shield film may be formed so as to cover a surface of the second sealing resin layer 4, side surfaces of the first sealing resin layer 5, and side surfaces of the substrate 2. In this way, the high-frequency modules 1 are completed.

According to the above-described embodiment, on the four-corner portions of the substrate to which stress is likely to be applied when the high-frequency module 1 is mounted on the external substrate, the terminal assemblies 6, each of which has the connection conductors 6a having a cross-sectional area larger than that of the connection conductors 7a of the terminal assemblies 7 mounted on another portion of the substrate, are mounted, and the resistance to stress is thereby increased and the connection reliability of the high-frequency module 1 to the external substrate can thus be increased. Two kinds of terminal assemblies that are the terminal assembly 6 including the large connection conductors 6a and the terminal assembly 7 including the small connection conductors 7a are provided, and costs in manufacturing the terminal assemblies can thereby be reduced and manufacturing costs of the high-frequency module 1 can consequently be reduced, compared with providing connection conductors having different sizes in one terminal assembly.

A liquid crystal polymer resin having a dielectric loss tangent lower than that of a resin used for the first sealing resin layer 5 is used for the resin blocks 6b and 7b that integrate the respective connection conductors 6a and 7a, and it is thereby possible to reduce stray capacitance between corresponding ones of the connection conductors 6a and 7a that are the external connection terminals of the high-frequency module 1 and to suppress signal loss.

The present disclosure is not limited to each of the above-described embodiments, and, other than the above-described embodiments, various modifications can be made without departing from the scope and spirit of the invention.

For example, although the connection conductor 6a of the terminal assembly 6 is formed thicker than the connection conductor 7a of the terminal assembly 7, the alignment interval between the connection conductors 6a may be formed smaller than that between the connection conductors 7a. That is, the connection conductors 6a of the terminal assembly 6 may be formed closer to one another compared with the connection conductors 7a of the terminal assembly 7. In such a case, the stress that is applied when the high-frequency module 1 is mounted on the external substrate can be dispersed, and the connection reliability can thereby be increased.

The present disclosure is widely applicable to modules in which components are mounted on a substrate and a shield is formed between the components.

1 module
2 substrate
2a upper surface (another main surface)
2b lower surface (one main surface)
3a component
4 second sealing resin layer
5 first sealing resin layer
6 first terminal assembly
7 second terminal assembly
6a, 7a connection conductor

The invention claimed is:

1. A high-frequency module comprising:
a circuit board;
a plurality of terminal assemblies provided on one main surface of the circuit board; and
a first sealing resin layer configured to cover the one main surface of the circuit board and the plurality of terminal assemblies,
wherein each of the plurality of terminal assemblies comprises a plurality of connection conductors vertically arranged in a resin block, and one end portion of each of the plurality of connection conductors is exposed at the resin block to be connected to the one main surface of the circuit board,
wherein the plurality of terminal assemblies are comprised of first terminal assemblies and second terminal assemblies, each of the first terminal assemblies includes first connection conductors among the plurality of connection conductors, each of the second terminal assemblies includes second connection conductors among the plurality of connection conductors, and a dimension parallel to the one main surface of each of the second connection conductors is smaller than a dimension parallel to the one main surface of each of the first connection conductors, and
wherein the first terminal assemblies are disposed on only four-corner portions of the one main surface of the circuit board, and the second terminal assemblies are disposed on portions other than the four-corner portions including side portions of the one main surface of the circuit board between the four-corner portions.

2. A high-frequency module comprising:
a circuit board;
a plurality of terminal assemblies provided on one main surface of the circuit board; and
a first sealing resin layer configured to cover the one main surface of the circuit board and the plurality of terminal assemblies,
wherein each of the plurality of terminal assemblies comprises a plurality of connection conductors vertically arranged in a resin block, and one end portion of each of the plurality of connection conductors is exposed at the resin block to be connected to the one main surface of the circuit board,
wherein the plurality of terminal assemblies comprises first terminal assemblies and second terminal assemblies, each of the first terminal assemblies includes first connection conductors among the plurality of connection conductors, each of the second terminal assemblies includes second connection conductors among the plurality of connection conductors, and the second connection conductors are aligned at wider intervals compared with the first connection conductors, and wherein the first terminal assemblies is are disposed on only four-corner portions of the one main surface of the circuit board, and the second terminal assemblies are disposed on portions other than the four-corner portions including side portions of the one main surface of the circuit board between the four-corner portions.

3. The high-frequency module according to claim 1,
wherein the resin block comprises a resin having a dielectric loss tangent smaller than a dielectric loss tangent of a resin comprised in the first sealing resin layer.

4. The high-frequency module according to claim 1, further comprising:
   a component mounted on another main surface of the circuit board; and
   a second sealing resin layer configured to cover the other main surface of the circuit board and the component.

5. The high-frequency-frequency module according to claim 2,
wherein the resin block comprises a resin having a dielectric loss tangent smaller than a dielectric loss tangent of a resin comprised in the first sealing resin layer.

6. The high-frequency module according to claim 2, further comprising:
   a component mounted on another main surface of the circuit board; and
   a second sealing resin layer configured to cover the other main surface of the circuit board and the component.

7. The high-frequency module according to claim 3, further comprising:
   a component mounted on another main surface of the circuit board; and
   a second sealing resin layer configured to cover the other main surface of the circuit board and the component.

* * * * *